United States Patent [19]

Terreault et al.

[11] 4,354,167

[45] Oct. 12, 1982

[54] MULTI-SUBSCRIBER DIFFERENTIATION AND DISTRIBUTION SWITCHING SYSTEM HAVING INTERCHANGEABLE DIFFERENTIATING CIRCUITS

[75] Inventors: Gérard Terreault, Pointe Claire; Yves Deflandre, Pierrefonds, both of Canada

[73] Assignee: 501 Centre de Recherche Industrielle du Quebec, Quebec, Canada

[21] Appl. No.: 214,281

[22] Filed: Dec. 8, 1980

[51] Int. Cl.³ .............................................. H03H 7/46
[52] U.S. Cl. ..................................... 333/103; 333/109; 333/132; 333/262; 455/3
[58] Field of Search .................... 333/3, 101, 103, 104, 333/105, 109, 115, 262, 129, 132, 100; 455/3, 133, 140

[56] References Cited

U.S. PATENT DOCUMENTS

| | | | |
|---|---|---|---|
| 2,058,108 | 10/1936 | Quinby et al. | 455/3 X |
| 2,775,740 | 12/1956 | Oliver | 333/115 |
| 3,611,016 | 10/1971 | Rogers et al. | 333/101 |
| 3,774,123 | 11/1973 | Hume | 333/103 X |
| 4,044,319 | 8/1977 | Seinecke | 333/101 |
| 4,165,497 | 8/1979 | Irons | 333/101 |

*Primary Examiner*—Paul L. Gensler
*Attorney, Agent, or Firm*—Oblon, Fisher, Spivak, McClelland & Maier

[57] ABSTRACT

A differentiation and distribution switching system for connecting selected ones of a plurality of subscriber lines for receiving a desired signal. The system comprises at least one differentiation circuit connected to an input signal, a removable support for the differentiation circuit, and a plurality of couplers connected to an output line of the differentiation circuit. A switch is connected to each coupler and an associated one of the subscriber lines, whereby to connect a signal on the output line to selected ones of the subscriber lines.

6 Claims, 3 Drawing Figures

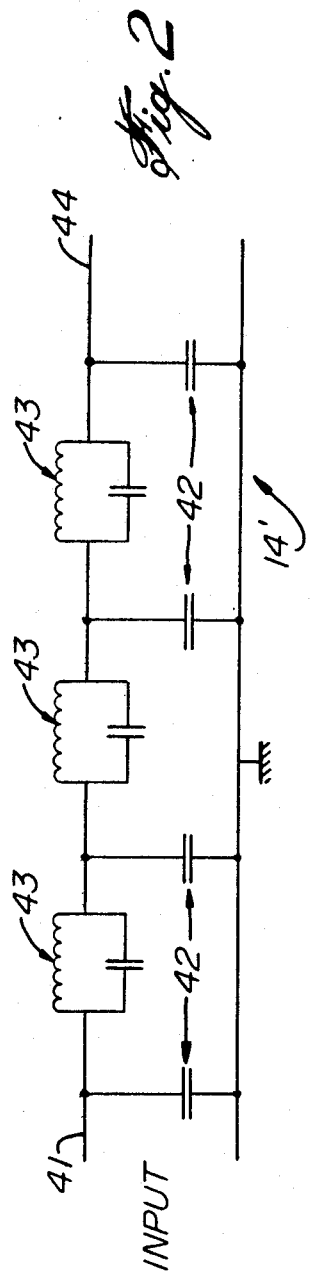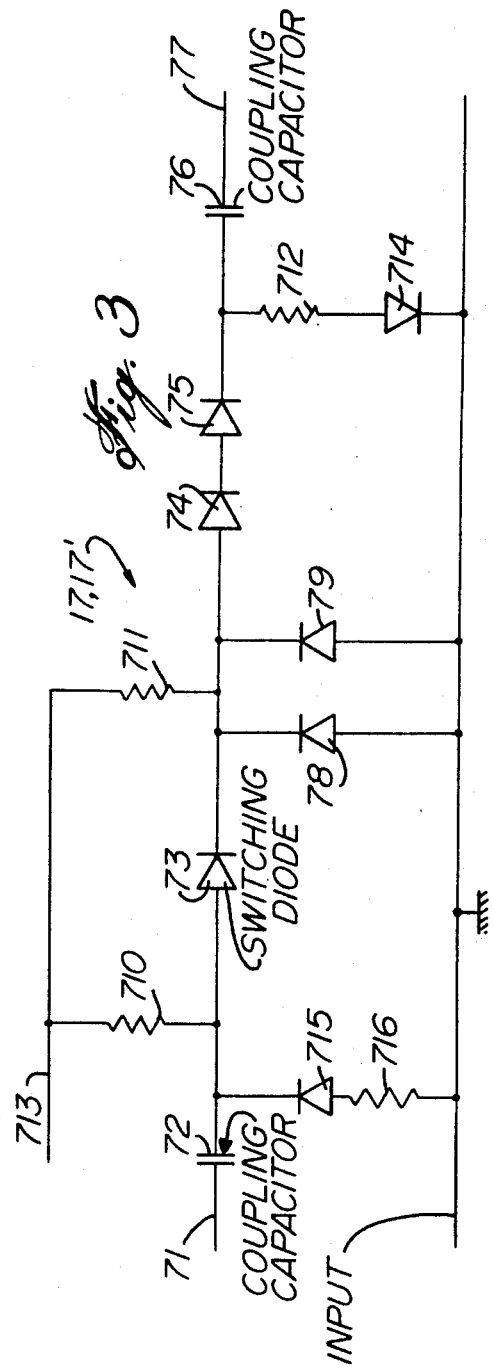

MULTI-SUBSCRIBER DIFFERENTIATION AND DISTRIBUTION SWITCHING SYSTEM HAVING INTERCHANGEABLE DIFFERENTIATING CIRCUITS

BACKGROUND OF INVENTION (a) Field of Invention

The present invention relates to a differentiation and distribution switching system and method for multi-user dwellings and more particularly, but not exclusively, for cable television signal distribution, having interchangeable differentiating circuits.

(b) Description of Prior Art

Various cable television distribution switching systems are known. However, these systems require that each subscriber be fed a composite cable television signal with a differentiating circuit being provided for each of the subscriber line to provide the subscriber the option of two or more levels of service such as a standard number of television channels or else specific television channels where additional cost is required for its reception. Also, it is common practice for the manufacture of the distributing switching systems to manufacture standard systems utilizing specific differentiating circuits. If the proprietor of the cable television signal requires a different quality differentiating circuit for his system, then it becomes expensive and difficult to adapt a different circuit to the switching circuits. Also, present switching circuits are not constructed to foresee eventual changes and often it is required to provide a complete new switching unit in order to adapt to new levels of services.

SUMMARY OF INVENTION

It is a feature of the present invention to provide a differentiation and distribution switching system for distributing cable television signals to multi-user dwellings and which substantially overcomes all of the above disadvantages.

It is a further feature of the present invention to provide a differentiation and distribution switching system for cable television signals wherein a common differentiating circuit(s) is utilized for a plurality of subscribers of the signal.

Another feature of the present invention is to provide a differentiating and distributing switching system for cable television signals wherein the differentiating circuits are easily replaceable in the switching unit.

Another feature of the present invention is to provide a differentiating and distributing switching system for cable television signals which is economical to construct and maintain thereby reducing the cost per subscriber.

Another feature of the present invention is to provide a method of differentiating and distributing a cable television signal to a plurality of subscribers and wherein the differentiating circuits are common to all of the subscribers.

According to the above features, from a broad aspect, the present invention provides a differentiation and distribution switching system for connecting selected ones of a plurality of subscriber lines for receiving a desired signal. The system comprises at least two differentiation circuits, one of which permits passage of the first selected signal portion of a composite signal connected to its input, and the other of which permits passage of a second selected signal portion of the composite signal. The composite signal is received from a main distribution line and connected to a splitter circuit to connect to an input of each of the two differentiation circuits. A switching circuit is also provided having a plurality of couplers connected to an output line of the differentiation circuits with a switch connected to each coupler and an associated one of the subscriber lines whereby to connect a signal on the output line of the differentiation circuits to selected one of the subscriber lines. Each of the differentiation circuits has a detachable support whereby it is easily interchanged without alteration to the switching circuit.

BRIEF DESCRIPTION OF DRAWINGS

A preferred embodiment of the present invention will now be described with reference to an example thereof as illustrated in the accompanying drawings, in which:

FIG. 2 is a schematic diagram illustrating an example of the construction of a differentiation circuit that may be used in the system; and FIG. 3 is a schematic diagram illustrating an example of the construction of the switches utilized in the distributing system.

DESCRIPTION OF PREFERRED EMBODIMENTS

Figure 1:
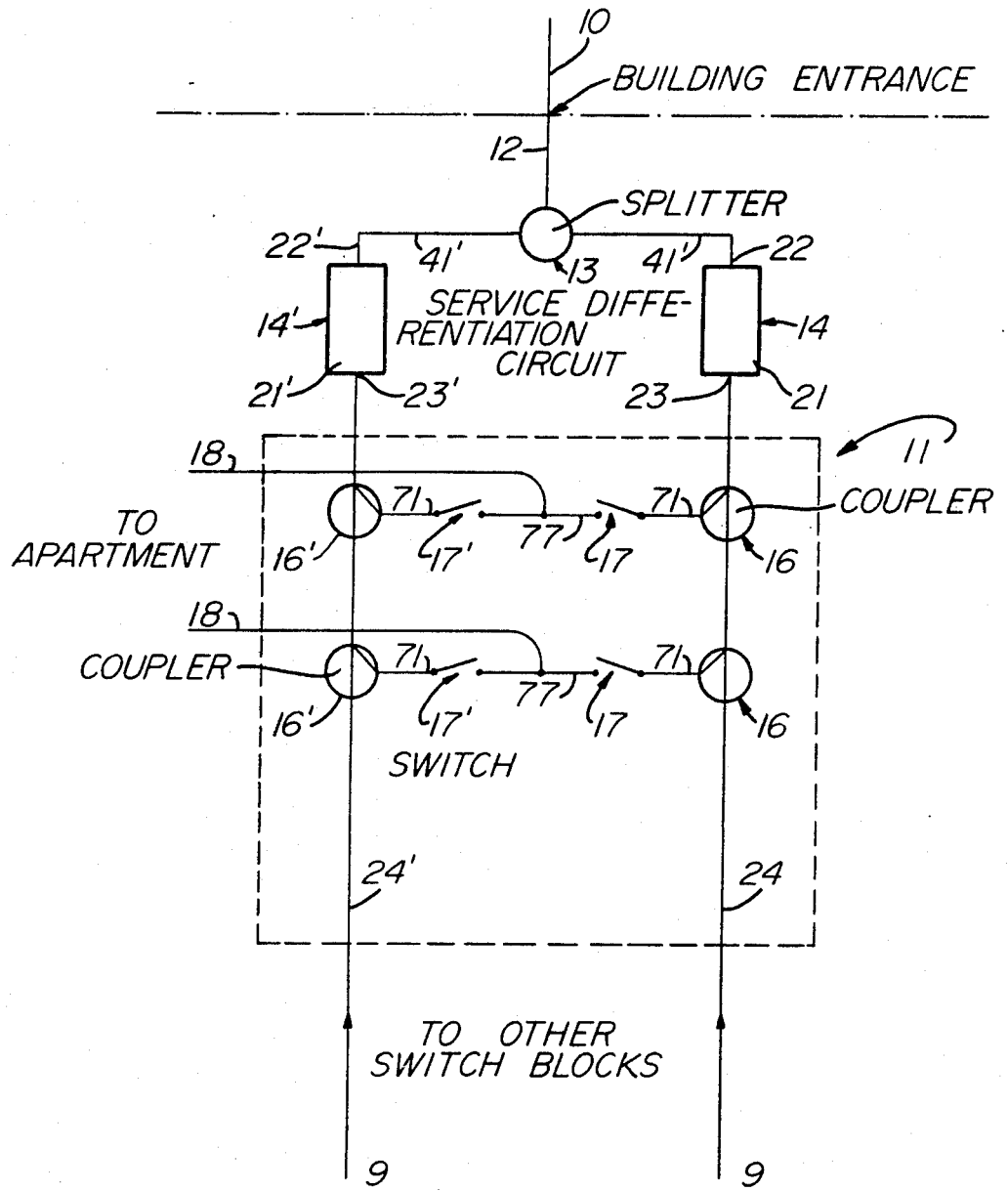
FIG. 1 is a simplified schematic diagram of the distributing system.

Referring now to the drawings and more particularly to FIG. 1, there is shown the cable television differentiating and distributing system of the present invention. A composite cable television signal is transmitted on a distribution line 10 to which a multi-user distribution system 11 is connected for reception of the composite television signal. The present invention relates to the distribution switching system 11 which feeds differentiated signal levels to selected ones of a plurality of subscribers. An input connection 12 connects to system 11 to the distribution line 10. This connection 12 couples the composite signal to a splitter circuit 13 which feeds the signal to two or more differentiating circuits 14. Two of such differentiating circuits 14 and 14' are shown in FIG. 1 as the input signal comprises two signal levels.

The differentiating circuits 14 and 14' may have many forms to suit the particularities of the television cable operating system, which particularities are dictated by the proprietor of the signal distribution network. Accordingly, the differentiating circuits 14 and 14' must be constructed such as to meet the requirements of the proprietor. In the present embodiment the differentiation circuit 14' is herein shown as constituted by a low pass filter (see FIG. 2) whereby to pass a certain band of the composite signal, such as standard television channels. The other differentiating circuit 14 may consist of a high pass filter (not shown) to pass another band which may contain, for example, pay television channels or other specific channels where the subscriber must pay additional monies for reception. Of course, the differentiating circuits may consist of any device such as filters, high pass, low pass, band pass, band stop, descrambling circuits, jammers, etc. Thus, at the output of each of the differentiating circuits 14 and 14' there will be provided a certain television service.

As herein shown, each of the differentiating circuits is provided in a detachable support 21 and 21' which have detachable input and output couplings 22 and 23 and 22' and 23' respectively whereby the circuits 14 and 14' are removably secured and easily interchangeable without the need to remove the entire distribution switching circuit 11 to effect the modification. With the present circuit construction it is possible to effect a field modification should any of the differentiating circuits need to be replaced.

The outputs 23 and 23' of each of the differentiating circuits 14 and 14' are connected to a respective internal distribution line 24 and 24', respectively, which carries their respective different output signals and couples each of them by means of couplers 16 and 16' to a plurality of subscriber switchlines 15. A subscriber dropline 18 connects to each of the switchlines 15 to receive one or both of the output signals from the differentiating circuits 14 and 14' or for detachment from the switchlines.

As herein shown, to each side of the connection between the droplines 18 and the switchlines 15 there is provided a switch 17 and 17'. This switch may be a mechanical switch which is locally operated or else, as in the present instance, it may consist of an electronic switch which is locally or remotely operated. Thus, if switch 17' is activated, the subscriber will be fed the signal from the differentiator 14'. If the subscriber desires the signal at the output of the differentiator 14, then switch 17 is activated with switch 17' remaining open. If no signal is to be connected to a particular subscriber dropline 18, then both switches 17 and 17' associated with that line are open. It is also foreseen that if both signals are to be provided at the same time to the subscriber, then a combiner circuit (not shown), but which construction is obvious to a man skilled in the art, could be provided in the distribution switching circuit at the junction between the dropline 18 and the switchline 15.

Referring now to FIG. 2 there is shown a typical construction of the differentiator circuit 14' as herein consisting of a low pass filter circuit. The input signal in branchline 41 connects to the input line 41 to the differentiator 14'. The filter circuit comprises a plurality of shunt capacitors 42 whereby the high frequency components of the signal are shunted whilst the low frequency components are passed through a series of LC networks 43 to provide a filtered signal at the output 44. This filter circuit is standard and well known to a person skilled in the art and no further description thereof is deemed necessary to describe the invention.

FIG. 3 shows the construction of the switches 17 or 17'. As shown, the output signals of each of the differentiators 14 and 14' are connected to a signal input line 71 which is connected to the input of the switches 17 and 17'. Each switch comprises a coupling capacitor 72 and a series of switching diodes 73, 74 and 75. These diodes are maintained non-conductive by a negative control voltage applied at the control line 713 through resistors 710 and 711 to bias these diodes non-conductive. Diodes 78 and 79, however, become conductive whereby to shunt the input signal on input line 71.

When the diodes 78 and 79 are rendered conductive, the line is terminated by a resistance 716. A diode 715 is connected in series with the resistance 716 across the signal lines with the diode 715 being biased the same as diodes 78 and 79. Without this resistance 716 the signal line would otherwise be open-ended causing reflection of the signal.

A light emitting diode 714, connected in series with resistance 712, is provided to indicate (when conductive) that the switch is activated, that is to say, when the switch is closed and feeding its input signal to the subscriber. To activate the switch a positive control signal is applied to the control line 713 thereby biasing the switching diodes 73, 74 and 75 in a conductive state passing the signal through coupling capacitor 76 to its output 77 which is connected to the switching line 15. When the switch 17 or 17' is conductive the diodes 78 and 79 become non-conductive. The light emitting diodes are suitably mounted on the enclosures 21 or 21' and are visible exteriorly thereof in association with an identification of each subscriber dropline.

It is within the ambit of the present invention to provide any obvious modifications of the example of the preferred embodiment described herein, provided such modifications fall within the scope of the appended claims. As above described, the differentiating circuits may be of a variety of forms and the switches may also comprise mechanical as well as electronic switches locally or remotely operated.

We claim:

1. A differentiation and distribution switching system for connecting selected ones of a plurality of subscriber lines for receiving a desired signal, said system comprising at least two differentiation circuits, one of said differentiation circuits permitting passage of a first selected signal portion of a composite signal connected to its input, the other of said differentiation circuits permitting passage of a second selected signal portion of said composite signal, said composite signal being received from a main distribution line and connected to a splitter circuit to connect to an input of each said two differentiation circuits, and a switching circuit having a plurality of couplers connected to an output line of said differentiation circuits with a switch connected to each said couplers and an associated one of said subscriber lines whereby to connect a signal on said output line of said differentiation circuits to selected ones of said subscriber lines, each said differentiation circuit having a detachable support whereby to be easily interchanged without alteration to said switching circuit.

2. A switching circuit as claimed in claim 1, wherein a switch line is connected between pairs of said couplers, each pair comprising one of said couplers from each output line of said two differentiation circuits, each switch of said pairs of couplers being connected in said switch line of each associated pair of couplers, each said subscriber line being connected to an associated one of said switch lines between the two switches connected in said associated one of said switch lines whereby each said subscriber line may be connected to the output of a selected one of said two differentiation circuits or disconnected from both by disabling a selected one or both said switches.

3. A switching circuit as claimed in claim 2, wherein each said differentiation circuits is a high pass filter, a low pass filter, a band pass filter, a band stop filter, a descrambling circuit or a jamming circuit.

4. A switching circuit as claimed in claim 2, wherein said switch is an electronic switching circuit having a series of switching diodes connected in series to an input signal, a control voltage line connected to a junction of said switching diodes, shunting diodes connected to said junction, a control signal connected to said control line, said control signal when of a specific polarity causing said shunting diodes to conduct to shunt said input signal and rendering said switch disabled.

5. A switching circuit as claimed in claim 4, wherein a light emitting device is connected to the output of said series of switching diodes to visually indicate the state of said switching diodes.

6. A switching circuit as claimed in claim 2, wherein said detachable support is a support enclosure for the circuit components of each said two differentiation circuits, said enclosure having detachable couplings at an input and output thereof to detachably disconnect said enclosure from said switching system.

* * * * *